United States Patent
Friedrich et al.

(10) Patent No.: US 10,365,312 B2
(45) Date of Patent: Jul. 30, 2019

(54) METHOD FOR DETECTION OF SHORT CIRCUITS WITHIN AN ENERGY STORAGE DEVICE

(71) Applicants: Robert Bosch GmbH, Stuttgart (DE); Lithium Energy and Power GmbH & Co. KG, Stuttgart (DE)

(72) Inventors: Marco Friedrich, Ludwigsburg (DE); Matthias Heil, Moeglingen (DE); Stefan Butzmann, Schalksmühle (DE); Christian Bernhardt, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/186,642

(22) Filed: Jun. 20, 2016

(65) Prior Publication Data

US 2016/0377667 A1    Dec. 29, 2016

(30) Foreign Application Priority Data

Jun. 23, 2015 (EP) .................................. 15173377

(51) Int. Cl.
*G01N 27/42* (2006.01)
*G01R 31/02* (2006.01)
(Continued)

(52) U.S. Cl.
CPC ....... *G01R 31/025* (2013.01); *G01R 31/3842* (2019.01); *G01R 31/396* (2019.01); *G01R 31/389* (2019.01)

(58) Field of Classification Search
CPC .......... G01R 31/3658; G01R 19/16542; G01R 31/3648; G01R 31/025; G01R 31/3624;
(Continued)

(56) References Cited

U.S. PATENT DOCUMENTS

| 6,255,803 B1 * | 7/2001 | Ishihara | ............ | G01R 31/3835 |
| | | | | 320/134 |
| 2010/0188054 A1 | 7/2010 | Asakura et al. | | |

(Continued)

FOREIGN PATENT DOCUMENTS

| DE | 10222175 | 11/2003 |
| EP | 1263111 | 12/2002 |

(Continued)

*Primary Examiner* — Richard Isla
*Assistant Examiner* — Mohammed J Sharief
(74) *Attorney, Agent, or Firm* — Michael Best & Friedrich LLP

(57) ABSTRACT

A method for detecting a short circuit within an energy store. The method includeds registering a current which flows through the energy store, registering a first voltage which is made available by the energy store at a first time, registering a second voltage which is made available by the energy store at a second time following the first time, determining whether the energy store is in a state of charge, a discharge state or in an open-circuit state, executing a first detection step when the energy store is in an open-circuit state, a second detection step when the energy store is in a state of charge, and a third detection step when the energy store is in a discharged state, and determining whether a short circuit is present based on the first and second voltage.

10 Claims, 2 Drawing Sheets

(51) Int. Cl.
*G01R 31/396* (2019.01)
*G01R 31/3842* (2019.01)
*G01R 31/389* (2019.01)

(58) Field of Classification Search
CPC ............ G01R 31/3662; G01R 31/3631; G01R 1/3682; H02J 7/0021; Y02E 60/12
USPC .................................... 324/429, 433, 434
See application file for complete search history.

(56) References Cited

U.S. PATENT DOCUMENTS

| | | | |
|---|---|---|---|
| 2010/0194398 A1 | 8/2010 | Kawasumi et al. | |
| 2011/0109275 A1* | 5/2011 | Taniguchi | H01M 10/44 320/145 |
| 2011/0148426 A1 | 6/2011 | Yokotani | |
| 2012/0004873 A1* | 1/2012 | Li | B60L 3/0046 702/63 |
| 2015/0070022 A1* | 3/2015 | Gordon | G01R 31/3606 324/426 |
| 2016/0054389 A1* | 2/2016 | Koba | G01R 31/3648 324/426 |

FOREIGN PATENT DOCUMENTS

| | | |
|---|---|---|
| EP | 2073031 | 6/2009 |
| JP | 2001110457 | 4/2001 |

\* cited by examiner

METHOD FOR DETECTION OF SHORT CIRCUITS WITHIN AN ENERGY STORAGE DEVICE

BACKGROUND OF THE INVENTION

The present invention relates to a method for detecting a short circuit within an energy store.

In electrochemical energy stores such as, for example, battery cells, which are used nowadays, undesired, potentially dangerous reactions of the energy store can occur when cell faults occur. In particular, the electrically conducive connections which occur within the energy store, for example internal short-circuits, short-circuits to ground or soft short circuits, represent a specific potential hazard, since as a result of an undesired current flow in the energy store the energy store can heat up strongly. It is therefore possible, for example, for strong heating of individual battery cells or a plurality of battery cells that occur in the battery module. Owing to this heating, when a critical temperature, in particular, a cell temperature is exceeded, a self-sustaining exothermic reaction of a battery cell can be triggered. This is also referred to as a thermal runaway. Cases in which burning and/or explosion of a cell has occurred as a result of such cell faults are known.

The potential hazard of electrochemical primary stores and secondary stores and the effects of a fault situation on persons, asset values and the environment is known.

The possible hazards posed by electrochemical energy stores are a challenge, in particular in the case of energy stores for electromobility applications such as, for example, passenger cars, trucks or transportation vehicles which are each equipped either with a fully electric drive or an electrically assisted drive. Battery systems in such applications often have to make available a high power level and a high level of stored energy and as a result involve a high potential hazard. However, at the same time stringent requirements are made of the safety of the energy store which are taken into account when designing the battery system. In particular for high-power cells and high-energy cells in the applications mentioned above it is desirable to detect cell faults which occur as early as possible and with a high level of reliability in order to avoid dangerous situations by warning the user and/or by means of technical counter measures.

Contemporary battery systems for use in electrical mobility are usually composed of a series circuit of a plurality of battery cells. The battery cells are usually combined in battery modules which are provided with a sensor system for monitoring the cells. A plurality of battery modules form a battery system. A central control unit of the battery system combines the signals of the sensor system in the battery modules and further sensor signals and implements simple control actions such as, for example, the complete switching off of the battery system in a fault situation. The cells in such battery systems are often high-power/high-energy cells in a specific design. The specific design is often distinguished by prismatic housings made of aluminum alloys or stainless steel. At present, lithium ion cells are usually used for the specified applications.

Methods for detecting a short circuit are known from US2010/0188054, US2010/0194398 and US2011/0148426.

SUMMARY OF THE INVENTION

The method according to the invention for detecting a short circuit within an energy store comprises registering a current which flows through the energy store, registering a first voltage which is made available by the energy store at a first time, registering a second voltage which is made available by the energy store at a second time following the first time, determining whether the energy store is in a state of charge, a discharged state or in an open-circuit state, on the basis of the registered first current, executing a first, second or third detection step on the basis of the determined state of charge. In this context, in the first detection step, which is executed when the energy store is in an open-circuit state, a short circuit is detected as being present if the second voltage is lower than the first voltage, in particular lower than the first voltage minus a first constant. In this context, in the second detection step, which is executed when the energy store is in a state of charge, a short circuit is detected as being present if the second voltage is lower than the first voltage, in particular lower than the first voltage minus a second constant. In this context, in the third detection step, which is executed if the energy store is in the discharged state, a short circuit is detected as being present if the second voltage is lower than the first voltage minus a differential voltage, in particular lower than the first voltage minus the differential voltage and minus a third constant.

It is therefore made possible for a short circuit which occurs suddenly within the energy store to be detected particularly quickly and easily. A short circuit can already be detected here when a very low, that is to say very spatially limited, electrically conductive connection occurs between a cathode and an anode of the energy store.

It is advantageous if the differential voltage is a maximum change in voltage which results from a maximum discharge current of the energy store. In this way, even in the case of a sudden occurring discharge current, it is ensured that a short circuit is reliably detected and a fault message which is on the basis of a drop in the second voltage owing to a rise in discharge current does not occur.

It is also advantageous if the differential voltage is an expected change in voltage which results from a measured discharge current of the energy store. It is therefore possible to differentiate particularly precisely between a second voltage in the case of which a short-circuit is present, and a second voltage in the case of which no short-circuit is present. It is therefore made possible for the time period between the registering of the first voltage and the registering of the second voltage to be selected to be particularly short, and therefore to permit very rapid detection of a short circuit.

It is furthermore advantageous if an internal resistance of the energy store is estimated, and the differential voltage is acquired on the basis of the internal resistance. In this way, the method can be adapted to a changing internal resistance of the energy store. It is therefore possible, for example, to prevent fault detections which are on the basis of temperature fluctuation of the energy store.

A device which is configured to execute the method according to the invention has all the advantages of the method according to the invention.

In this context it is advantageous if the device comprises a capacitor by means of which the first voltage is registered and held in reserve. In this way, the first voltage can be registered particularly quickly and is immediately available after the registration for the evaluation which is defined in the detection steps. A time interval between the first time and the second time can therefore be selected to be particularly short, as a result of which particularly rapid detection of a short circuit within the energy store is made possible.

It is also advantageous if the device comprises a diode which is connected in such a way that it permits charging of the capacitor by means of a voltage which is made available by the energy store, but prevents discharging of the capacitor. In this way, it is ensured that no undesired discharging of the capacitor into a load which is connected to the energy store, which could result in a fault detection, takes place.

It is also advantageous if the device comprises a switch via which the capacitor can be connected in a disconnectable fashion to an output of the energy store. In this way, the capacitor, or the voltage stored therein, can be discharged and the voltage which is stored in the capacitor can be fed to a load.

BRIEF DESCRIPTION OF THE DRAWINGS

Exemplary embodiments of the invention are described below in detail with reference to the accompanying drawing, in which.

DETAILED DESCRIPTION

Figure 1:
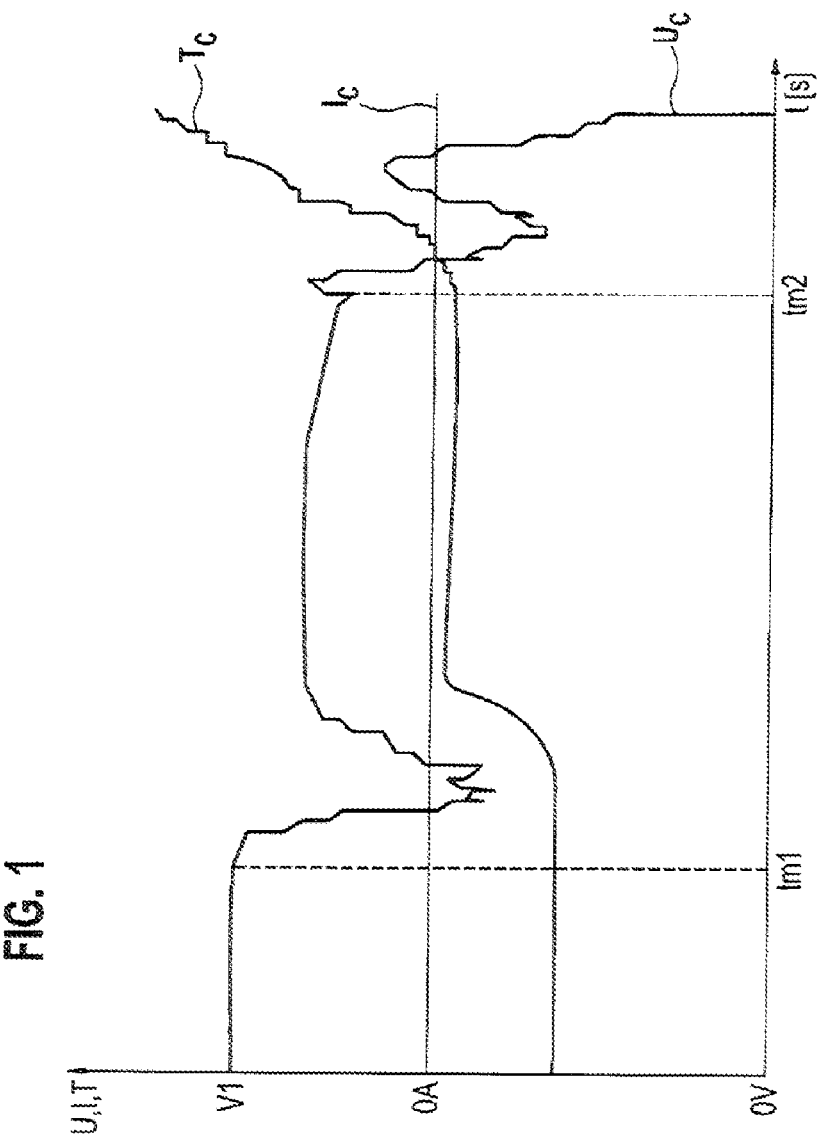
FIG. 1 shows a diagram, which shows a voltage profile, a current profile and a temperature profile of an energy store in the case of a short circuit.

FIG. 1 shows a voltage profile, a current profile and a temperature profile of an energy store. The energy store is a battery cell 2 here. The current profile therefore shows a profile of a cell current $I_C$ plotted over time. The voltage profile shows a profile of a cell voltage $U_C$ plotted over time. The temperature profile shows a profile of a cell temperature $T_C$ plotted over time.

In the case illustrated in FIG. 1, the energy store is in an open-circuit state. The cell current $I_C$ is therefore constant at 0 amps. The cell voltage $U_C$ firstly proceeds constantly to the voltage value of an open-circuit voltage V1. However, at a short circuit time tm1 the cell voltage $U_C$ drops. It is apparent that the cell voltage $U_C$ does not drop immediately to 0 volts. Instead, there is merely a rise in the cell temperature $T_C$, wherein the cell voltage $U_C$ recovers somewhat, but still remains below the voltage value of the open-circuit voltage V1. The cell voltage $U_C$ only collapses completely at a later time tm2, and a renewed rise in the cell temperature $T_C$ occurs, caused by thermal runaway of the battery cell 2.

FIG. 1 therefore shows by way of example a profile of the cell current $I_C$ through the battery cells 2, a profile of the cell voltage $U_C$ at the cell terminals of the battery cell 2 and a profile of the battery temperature $T_C$ of the battery cell 2 when internal short-circuits occur. In the left-hand part of the curves illustrated in FIG. 1, a voltage dip as a result of a sudden occurrence of an internal short-circuit can be seen, but said voltage dip leads only to a limited increase in the cell temperature $T_C$, therefore not yet to a critical cell behavior. The cell voltage $U_C$ returns to a relatively high value after a few seconds. In the right-hand part of the curves illustrated in FIG. 1, multiple voltage dips are shown again, said voltage dips leading here to a critical rise in the cell temperature $T_C$ and therefore to what is referred to as thermal runaway of the battery cell 2.

Figure 2:
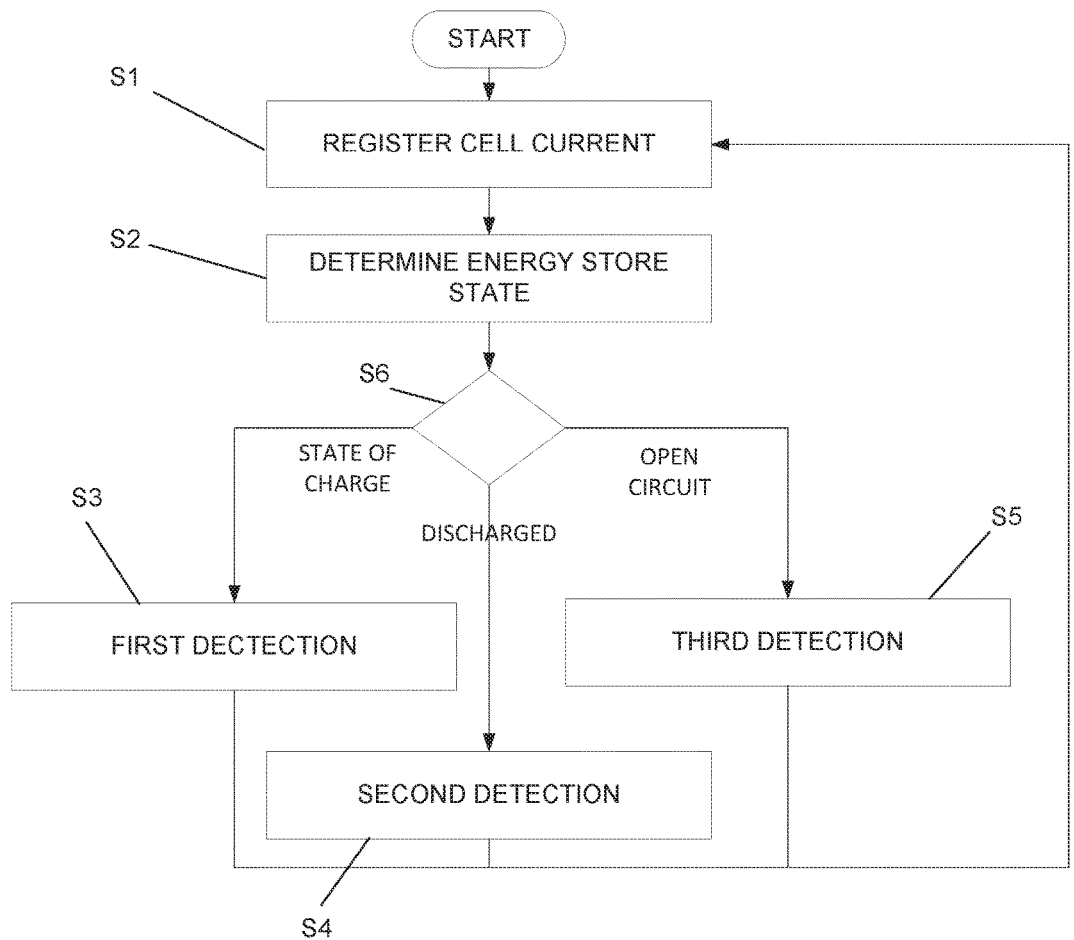
FIG. 2 shows a flow diagram of the method according to the invention in a first embodiment.

FIG. 2 shows a flow diagram of the method according to the invention in a first embodiment. The method is started when the battery cell 2 is actuated. After the start of the method, a first step S1 is executed.

In the first step S1, the cell current $I_C$ which flows through the energy store is registered. The registering is carried out, for example, by means of a current sensor which is arranged on an output of the battery cell 2. The cell current $I_C$ is registered here at a first time, and is stored as a measured value of the current which describes a first current. The cell current $I_C$ is also registered at a second time and stored as a measured value of the current which describes a second current $I_n$.

In addition, in the first step S1 a first voltage $U_{n-1}$, which is made available by the energy store at a first time n−1 is made available, and a second voltage $U_n$, which is made available by the energy store at the second time n following the first time n−1 is registered. The first voltage $U_{n-1}$ is the cell voltage $U_C$ at the first time n−1. The second voltage $U_n$ is the cell voltage $U_C$ at the second time n. The first time n−1 and the second time n are here times which follow one another in brief succession. Therefore, a time interval between the first time n−1 and the second time n could, for example, be shorter than a second. The registering of the first voltage $U_{n-1}$ and of the second voltage $U_n$ is carried out in this first embodiment by means of a voltage sensor which registers a voltage between a positive pole and a negative pole of the battery cell 2. The first voltage $U_{n-1}$ and the second voltage $U_n$ are each stored as a voltage measured value.

After the first step S1, a second step S2 is executed.

In the second step S2, it is determined whether the energy store is in a state of charge, a discharged state or in an open circuit state. This is done on the basis of the registered first current $I_{n-1}$. In this context it is determined that the energy store is in a state of charge if the first current $I_{n-1}$ is lower than 0 amps. It is determined that the energy store is in a discharged state if the first current $I_{n-1}$ is higher than 0 amps. It is determined that the energy store is in an open-circuit state if the first current $I_{n-1}$ is equal to 0 amps. It is to be noted that the determination as to whether the energy store is in a state of charge, a discharged state or in an open-circuit state can also be carried out on the basis of the registered second current $I_n$ or a cell current $I_C$ which is registered at another time.

After the second step S2, a first detection step S3, a second detection step S4 or a third detection step S5 is executed. For this purpose, in a decision step S6, which follows the second step S2, it is checked whether the state of charge, the discharged state or the open-circuit state is present, and accordingly the first detection step S3, the second detection step S4 or the third detection step S5 is called and executed.

If the energy store is in an open-circuit state, which is the case if the first current $I_{n-1}$ is equal to 0 amps, the first detection step S3 is executed. In the first detection step S3, a short circuit is detected as being present if the second voltage $U_n$ is lower than the first voltage $U_{n-1}$ minus a first constant ε1. This can be checked, for example, by checking whether the following first formula is true.

$$U_n \leq U_{n-1} - \varepsilon 1 \tag{1}$$

If no cell current flows through the battery cell 2, and if the first current $I_C$ is therefore equal to 0 amps, it is to be expected that the cell voltage $U_C$ of the battery cell 2 is largely constant if no fault is present, apart from a slight drop which is caused by self-discharge of the cell. A battery cell fault as a result of an internal short-circuit is detected if a drop of the cell voltage $U_C$ is measured, which takes place here as a result of a comparison of the cell voltage $U_C$ at the first time n−1, that is to say of the first voltage $U_{n-1}$, and the cell voltage $U_C$ at the second time n, that is to say of the second voltage $U_n$. The first constant ε1 is here a voltage value which is small in magnitude and which defines a sensitivity during the detection of a short circuit. A fault detection of a short circuit owing to a measurement deviation is therefore prevented from taking place. The first time n−1 and the second time n refer to a time in general, which can be a continuous time, a discrete time as well as time values which averaged over a time range.

The second detection step S4 is executed if the energy store is in a state of charge, that is to say the first current $I_{n-1}$ is lower than 0 amps. In the second detection step S4, a short circuit is detected as being present if the second voltage $U_n$ is lower than the first voltage $U_{n-1}$ minus a second constant ε2.

During charging of the battery cell 2, the cell voltage $U_C$ increases continuously as long as there is no fault present in the battery cell 2. A fault in the battery cell 2, such as is present in the case of an internal short-circuit, is therefore detected if the cell voltage $U_C$ drops. This can be checked, for example, by checking whether the following second formula is true.

$$U_n \leq U_{n-1} - \varepsilon 2 \quad (2)$$

The second constant ε2 is, in this context, equal to the first constant ε1 and also serves to prevent a fault detection of a short circuit owing to a measurement deviation from taking place.

The third detection step S5 is executed if the energy store is in the discharged state, that is to say the first current $I_{n-1}$ is higher than 0 amps. In the case of discharging of the battery cell 2, voltage drops also occur which are caused by a rise in the cell current $I_C$ which occurs, for example, in the case of a change in load. Therefore, it is necessary to differentiate between usual voltage drops and voltage drops which are caused by a short circuit. This must be done with a high level of reliability.

A short circuit is detected as being present if the second voltage $U_n$ is lower than the first voltage $U_{n-1}$ minus a differential voltage $\Delta U$ and minus a third constant ε3. This can be checked, for example, by checking whether the following third formula is true:

$$U_n \leq U_{n-1} - \Delta U - \varepsilon 3 \quad (3)$$

The differential voltage $\Delta U$ is a maximum differential voltage $\Delta U$ max in this embodiment. The maximum differential voltage $\Delta U_{max}$ results from a maximum change in the cell current $\Delta I_{max}$ and an internal resistance $R_C$ of the battery cell 2. The maximum differential voltage $\Delta U_{max}$ can therefore be described in a fourth formula:

$$\Delta U_{max} = \Delta I_{max} \cdot R_C \quad (4)$$

The maximum change in the cell current $\Delta I_{max}$ is here a difference between the cell current $I_C$ at the first time n−1 compared to the cell current $I_C$ at the second time n. The cell current $I_C$ at the first time n−1 is the first current $I_{n-1}$. The cell current $I_C$ at the second time n is the second current L. The maximum change in the cell current $\Delta I_{max}$ can therefore be described in a fifth formula:

$$\Delta I_{max} = I_n - I_{n-1} \quad (5)$$

In this embodiment, the differential voltage $\Delta U$ is therefore a differential voltage which results from a change in the battery current $I_C$ between the first time n−1 and the second time n. The third constant ε3 corresponds to the first constant ε1 and the second constant ε2.

The internal resistance $R_C$ is a meaningful estimate of the internal resistance of the battery cell 2, which resistance can also change over time and can be acquired by means of any desired method for determining the internal resistance.

Since both the first current and the second current $I_n$ have been registered in the second step S2, in this embodiment the maximum change in the cell current $\Delta I_{max}$ is calculated according to the fifth formula. On the basis thereof, the maximum differential voltage $\Delta U_{max}$ is calculated in accordance with the fourth formula. This calculated maximum differential voltage $\Delta U_{max}$ is used as a differential voltage $\Delta U$ in the third formula. The differential voltage $\Delta U$ is therefore a maximum change in voltage which results from a maximum discharge current of the energy store.

After the first detection step S3, the second detection step S4 or the third detection step S5, the first step S1 is executed again in each case and the method is therefore repeated in a loop.

It is to be noted that the first voltage $U_{n-1}$ which is registered at one pass of the method can be the second voltage $U_n$ from a preceding pass of the method. In addition, it is to be noted that the differential voltage $\Delta U$ can also be a previously defined constant which describes a typical differential voltage. The latter can be acquired, for example, on the basis of a maximum discharge current which is typical for the battery cell 2.

A second embodiment of the invention corresponds to the first embodiment of the invention. However, in the third detection step S5 the differential voltage $\Delta U$ is an expected voltage which results from a measured discharge current of the energy store and the internal resistance $R_C$.

Therefore, the battery voltage $U_C$ in the case of discharging of the battery cell 2 is equal to the open-circuit voltage $U_{OCV}$ of the battery cell 2 minus a voltage which results from a battery current $I_C$ in the case of discharging and the internal resistance $R_C$ of the battery cell 2 at this time. This ratio is described in the following sixth formula.

$$U_C = U_{OCV} - I_C \cdot R_C \quad (6)$$

In the second embodiment, a short circuit is also detected as being present if the second voltage $U_n$ is lower than the first voltage $U_{n-1}$ minus a differential voltage $\Delta U$ and minus a third constant ε3. In this context, the differential voltage is considered to be a difference between the open-circuit voltage $U_{OCV}$ and the battery voltage $U_C$. Therefore, in the third detection step S5 it is checked whether the following seventh formula is true.

$$U_n \leq U_{n-1} - I_C \cdot R_C - \varepsilon 3 \quad (7)$$

In this context, the internal resistance $R_C$ is selected in accordance with the first embodiment, and the battery current $I_C$ is acquired by means of renewed measurement. Alternatively, it is also possible to have recourse to previously registered measured values for the determination of the battery current $I_c$. The differential voltage $\Delta U$ is therefore an expected change in voltage which results from a measured discharge current of the battery cell 2.

Both in the first and second embodiments, it is checked on the basis of the true content of predefined conditions whether a short circuit is present within a battery cell 2. This checking can be carried out either by means of an analog or by means of a digital evaluation. It is therefore possible, for example for all the measured voltages and currents to be fed as digital values to a computing unit and for mathematical evaluation to be carried out in this computing unit in accordance with the described formulae. A software-supported evaluation would therefore take place.

In the case of such a software-supported evaluation, it is possible, inter alia, for the values required in the formulae described above to be extracted from a multiplicity of measured values, for example by the formation of average mean values. In addition, for example a plurality of estimated values for the internal resistance $R_C$ can be acquired. The reliability of the method is increased by such inclusion of a plurality of measured values and committed values.

Alternatively, an analog evaluation is also possible by means of an analog circuit which, in particular, does not require software implementation either. In this context, it is made possible, inter alia, to register deviations of the measured values particularly quickly and therefore, for example, also between two sampling processes by means of an analog/digital converter.

In the embodiments described above, an analog evaluation is possible. This is possible, for example, by means of a comparison of current measured values of the cell voltage $U_C$, for example of the second voltage $U_n$ and of a number of previously registered measured values of the cell voltage $U_C$, for example of the first voltage $U_{n-1}$, by means of an operational amplifier. It is therefore possible for the previously registered measured values to be applied to an input of an operational amplifier, for example via an RC circuit. If a difference between the signals exceeds a threshold value determined by means of the formulae described above, a cell fault, that is to say a short circuit is detected. A threshold value which is dependent on the cell current $I_C$ can also be made available by means of an operational amplifier circuit here.

Figure 3:
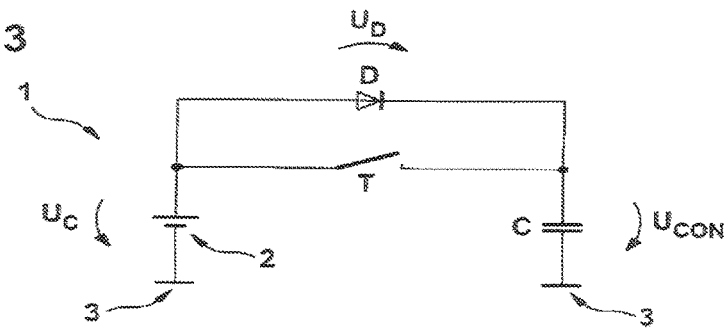
FIG. 3 shows a circuit included by a device by means of which the method according to the invention is executed in the first embodiment.

A circuit 1 of a preferred device for detecting a short circuit is shown in FIG. 3. The circuit 1 permits a short circuit to be detected in the case of discharging of the battery cell 2. The circuit 1 comprises a rectifier which is formed by a diode D in the circuit shown in FIG. 3. The circuit 1 also comprises a storage unit which is formed by a capacitor C in the circuit shown in FIG. 3. The circuit 1 also comprises a controllable switch T which is formed, for example, by a transistor, for example an FET. The circuit comprises further components such as, for example, resistors for limiting a charge current, but these components are not illustrated in FIG. 3. The capacitor C can therefore be connected to an output of the battery cell 2 means of the switch T in such a way that it can be disconnected by, said output being formed by the positive pole and the negative pole of the battery cell 2.

A negative pole of the battery cell 2 is connected to a circuit ground 3. A positive pole of the battery cell 2 is connected to an anode of the diode D. The positive pole of the battery cell 2 is also connected to a first switching contact of the switch T. A cathode of the diode D is connected to a first pole of the capacitor C. A second switching contact of the switch T is also connected to the first pole of the capacitor C. The switch T switches an electrical connection between its first switching contact and its second switching contact. A second pole of the capacitor C is connected to the circuit ground 3.

In the case of charging of the battery cell 2, storage of preceding voltage values of the cell voltage $U_C$ is therefore made possible. In the case of charging of the battery cell 2, the switch T is in an open state. The capacitor C is charged via the diode D and keeps this voltage in reserve as a capacitor voltage $U_{CON}$.

This capacitor voltage can be, for example, the first voltage $U_{n-1}$ of the first and second embodiments. This voltage $U_{n-1}$ is compared with the second voltage $U_n$ which corresponds to the current cell voltage $U_C$ across the battery cell 2. Such a comparison is carried out, for example, by means of a capacitor which is not shown in FIG. 3. In this context, it is necessary, however, to take into account a voltage drop $U_D$ across the diode D, since a ratio between the cell voltage $U_C$ across the battery cell 2 to the capacitor voltage $U_{CON}$ is brought about in accordance with the following eighth formula.

$$U_{CON}=U_C-U_D \qquad (8)$$

The voltage drop $U_D$ across the diode corresponds here to a forward voltage of the diode D. In the case of charging of the battery cell 2, storage of voltage values of the cell voltage $U_C$ is therefore made possible, wherein this takes place particularly quickly and with little expenditure. If a sudden voltage drop of the cell voltage $U_C$ occurs when the switch T is in an open state, the capacitor voltage $U_{CON}$ describes a voltage value of the cell voltage $U_C$ before the sudden voltage drop. The diode D is therefore connected in such a way that it permits charging of the capacitor C by means of a voltage made available by the battery cell 2, but prevents discharging of the capacitor C.

During the charging of the battery cell 2 the circuit can therefore be used to detect a short circuit. A short circuit is present when the condition formulated in the following ninth formula is detected as being true.

$$U_C \leq U_{CON}-U_D-\varepsilon \qquad (9)$$

In this context, the constant $\varepsilon$ is in turn a correction factor for the adaptation of a measuring sensitivity.

During the discharging of the battery cell 2, the switch T is closed in order to permit discharging of the capacitor C to the cell voltage $U_C$. It is therefore not possible to detect a short circuit during discharging of the battery cell 2 or during relatively long quiescent times of the battery cell with the circuit 1, but it is nevertheless possible shortly after the start of the quiescent time.

In addition to the written disclosure above, reference is explicitly made to the disclosure in FIGS. 1 to 3.

The invention claimed is:

1. A method for detecting a short circuit within an energy store, the method comprising:
    registering a current ($I_c$), detected by a current sensor, which flows through the energy store,
    registering, on a capacitor (C) connected to the energy store via a parallel connected diode and switch, a first voltage ($U_{n-1}$) which is made available by the energy store at a first time ($t_{n-1}$),
    registering a second voltage ($U_n$) which is made available by the energy store at a second time ($t_n$) following the first time ($t_{n-1}$),
    comparing the second voltage ($U_n$) to the first voltage ($U_{n-1}$) registered on the capacitor (C),
    determining whether the energy store is in a state of charge, a discharge state or in an open-circuit state, on the basis of the registered first current ($I_c$),
    executing a first, second or third detection step on the basis of the determined state of charge, wherein
    in the first detection step, which is executed when the energy store is in the open-circuit state, the short circuit is detected as being present if the second voltage ($U_n$) is lower than the first voltage ($U_{n-1}$) minus a first constant ($\varepsilon_1$),
    in the second detection step, which is executed when the energy store is in the state of charge, the short circuit is detected as being present if the second voltage ($U_n$) is lower than the first voltage ($U_{n-1}$), and in the third detection step, which is executed when the energy store is in the discharge state, the short circuit is detected as being present if the second voltage ($U_n$) is lower than the first voltage ($U_{n-1}$) minus a differential voltage ($\Delta U$)); and when the short circuit is detected, a central controller switches off a battery system which includes the energy store;

wherein the short circuit is detected when a very low spatially limited electrically conductive connection occurs between a cathode and an anode of the energy store, and the short circuit is detected quickly enough to prevent thermal runaway or damage to the energy store; and wherein the switch is open in the charge state and closed in the discharge state.

2. The method according to claim 1, wherein the differential voltage ($\Delta U$) is a maximum change in voltage which results from a maximum discharge current of the energy store.

3. The method according to claim 1, wherein the differential voltage ($\Delta U$) is an expected change in voltage which results from a measured discharge current of the energy store.

4. The method according to claim 1, wherein an internal resistance ($R_c$) of the energy store is estimated, and the differential voltage ($\Delta U$) is acquired on the basis of the internal resistance ($R_c$).

5. The method according to claim 1, wherein in the second detection step, which is executed when the energy store is in the state of charge, the short circuit is detected as being present if the second voltage ($U_n$) is lower than the first voltage ($U_{n-1}$) minus a second constant ($\varepsilon_2$).

6. The method according to claim 1, wherein in the third detection step, which is executed when the energy store is in the discharge state, the short circuit is detected as being present if the second voltage ($U_n$) is lower than the first voltage ($U_{n-1}$) minus the differential voltage ($\Delta U$) and minus a third constant ($\varepsilon_3$).

7. A device configured to detect a short circuit within an energy store by:

registering a current (Ic), detected by a current sensor, which flows through the energy store, registering, on a capacitor (C) connected to the energy store via a parallel connected diode and switch, a first voltage (Un−1) which is made available by the energy store at a first time (tn−1), registering a second voltage (Un) which is made available by the energy store at a second time (tn) following the first time (tn−1), comparing the second voltage (Un) to the first voltage (Un−1) registered on the capacitor (C), determining whether the energy store is in a state of charge, a discharge state or in an open-circuit state, on the basis of the registered first current (Ic), executing a first, second or third detection step on the basis of the determined state of charge, wherein in the first detection step, which is executed when the energy store is in the open-circuit state, the short circuit is detected as being present if the second voltage (Un) is lower than the first voltage (Un−1) minus a first constant ($\varepsilon_1$), in the second detection step, which is executed when the energy store is in the state of charge, the short circuit is detected as being present if the second voltage (Un) is lower than the first voltage (Un−1), and in the third detection step, which is executed when the energy store is in the discharge state, the short circuit is detected as being present if the second voltage (Un) is lower than the first voltage (Un−1) minus a differential voltage ($\Delta U$); and when the short circuit is detected, a central controller switches off a battery system which includes the energy store;

wherein the short circuit is detected when a very low spatially limited electrically conductive connection occurs between a cathode and an anode of the energy store, and the short circuit is detected quickly enough to prevent thermal runaway or damage to the energy store; and wherein the switch is open in the charge state and closed in the discharge state.

8. The device according to claim 7, wherein the device comprises a capacitor (C) by which a first voltage ($U_{n-1}$) is registered and held in reserve.

9. The device according to claim 8, wherein the device comprises a diode (D) which is connected in such a way that it permits charging of the capacitor (C) by a voltage which is made available by the energy store, but prevents discharging of the capacitor (C).

10. The device according to claim 8, wherein the device comprises a switch via which the capacitor (C) is connected in a disconnectable fashion to an output of the energy store.

* * * * *